(12) United States Patent  (10) Patent No.: US 7,935,581 B2
Hwang  (45) Date of Patent: May 3, 2011

(54) METHOD OF FABRICATING THIN FILM TRANSISTOR ARRAY SUBSTRATE

(75) Inventor: Eui-Hoon Hwang, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 633 days.

(21) Appl. No.: 11/889,175

(22) Filed: Aug. 9, 2007

(65) Prior Publication Data

US 2008/0038884 A1 Feb. 14, 2008

(30) Foreign Application Priority Data

Aug. 11, 2006 (KR) .......................... 10-2006-0076297

(51) Int. Cl.
*H01L 21/00* (2006.01)
(52) U.S. Cl. . 438/149; 438/153; 438/155; 257/E21.413; 257/E21.7; 257/E29.117; 257/E29.273; 257/E29.275
(58) Field of Classification Search .................. 438/149, 438/153, 155; 257/E21.413, E21.7, E29.117, 257/E29.273, E29.275
See application file for complete search history.

(56) References Cited

U.S. PATENT DOCUMENTS

| | | | |
|---|---|---|---|
| 5,879,969 A | 3/1999 | Yamazaki et al. | |
| 6,331,718 B1 | 12/2001 | Yamazaki et al. | |
| 6,593,179 B2 | 7/2003 | Ogata | |
| 7,422,934 B2 * | 9/2008 | Yamazaki et al. | 438/151 |
| 2005/0106787 A1 | 5/2005 | Oh et al. | |
| 2005/0127443 A1 * | 6/2005 | Ishikawa | 257/347 |
| 2008/0023704 A1 * | 1/2008 | Noda et al. | 257/72 |

FOREIGN PATENT DOCUMENTS

| | | |
|---|---|---|
| JP | 09-153624 | 6/1997 |
| KR | 10-1999-0011905 | 2/1999 |
| KR | 100267981 | 7/2000 |
| KR | 10-2003-0054795 | 7/2003 |
| KR | 10-2003-0085239 | 11/2003 |
| KR | 10-2003-0096674 | 12/2003 |
| KR | 10-2004-0058699 | 7/2004 |
| KR | 10-2004-0106794 | 12/2004 |
| KR | 10-2005-0052286 | 6/2005 |
| KR | 10-2005-0121601 | 12/2005 |
| KR | 10-2006-0000848 | 1/2006 |
| KR | 10-2006-0001754 | 1/2006 |

OTHER PUBLICATIONS

*The Notice of Allowance* from the Korean Intellectual Property Office issued in Applicant's corresponding Korean Patent Application No. 10-2006-0076297 dated Nov. 12, 2007.

* cited by examiner

*Primary Examiner* — David Vu
*Assistant Examiner* — Brandon Fox
(74) *Attorney, Agent, or Firm* — Robert E. Bushnell, Esq.

(57) ABSTRACT

A method of fabricating a TFT array substrate that prevents mobile ions from moving from a photoresist to channels of the TFT by the gate electrode of the TFT by performing photolithography processes for ion injection after forming gate electrode of TFT and, in addition, a method of fabricating a TFT array substrate that omits a photolithography process for forming a lower electrode of a storage capacitor by forming the lower electrode of the storage capacitor by a channel doping process for a PMOS TFT.

17 Claims, 17 Drawing Sheets

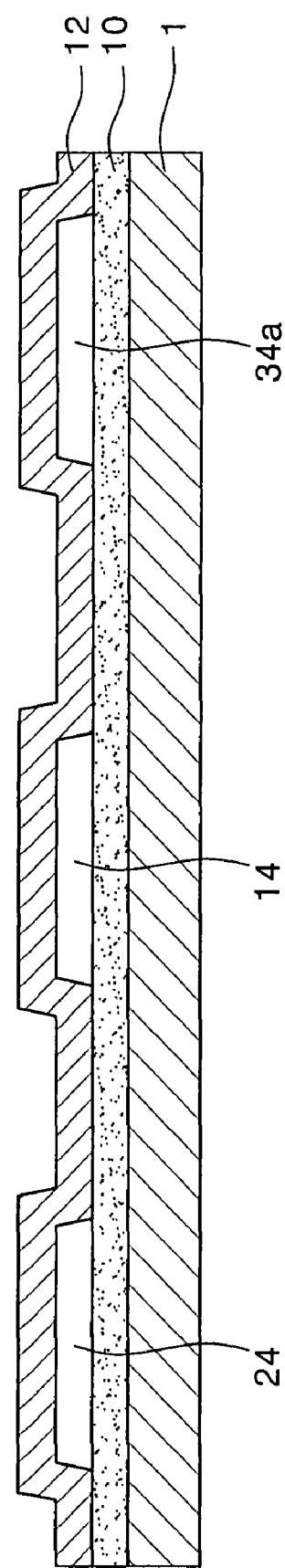

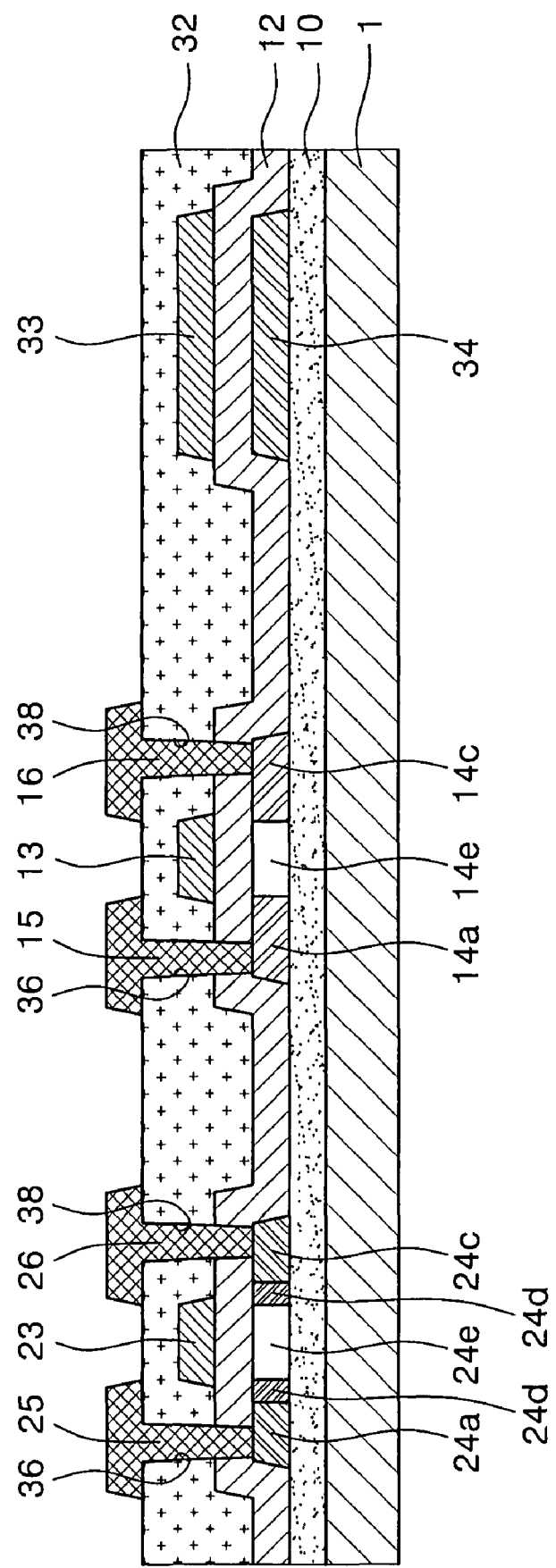

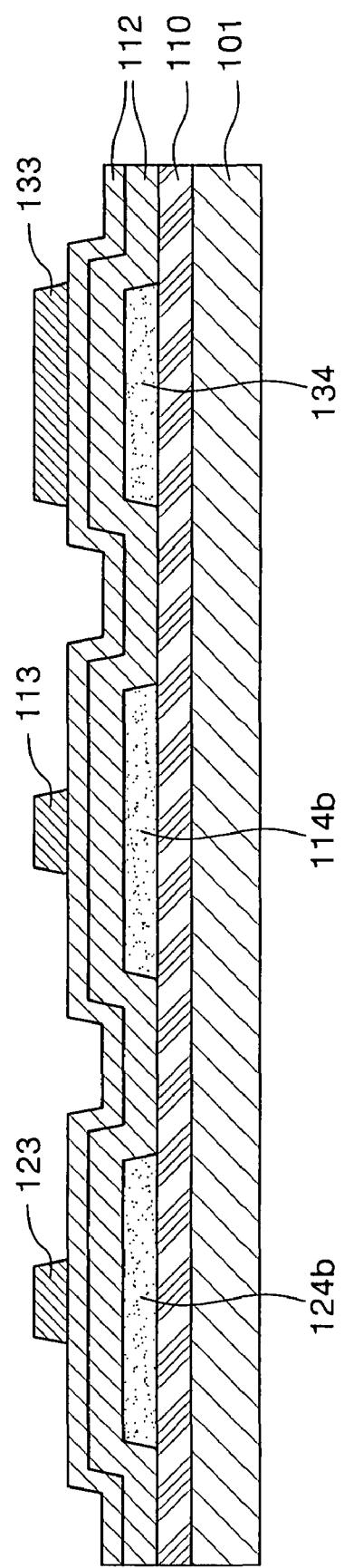

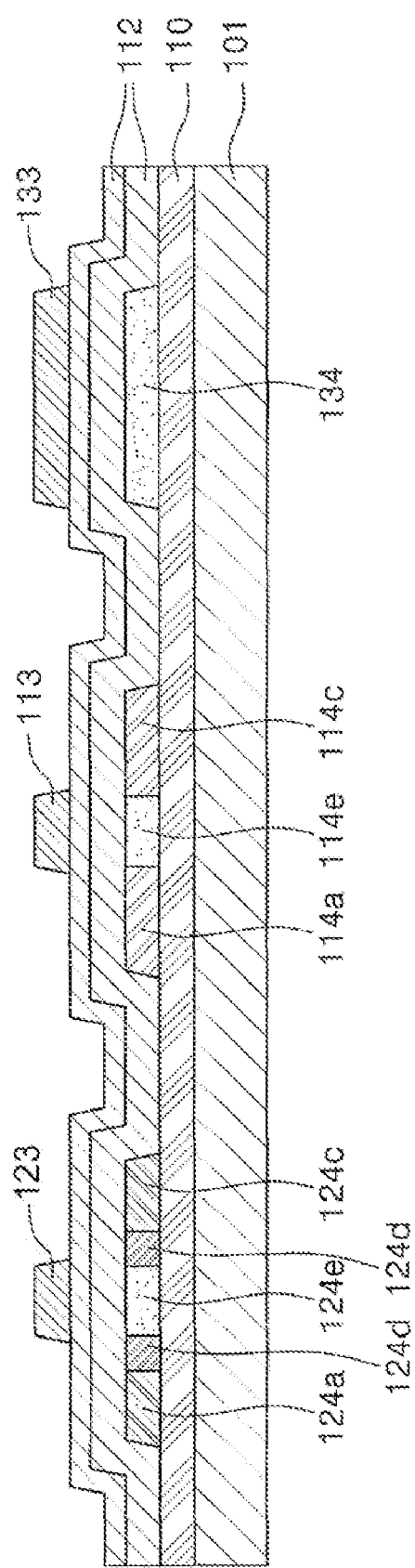

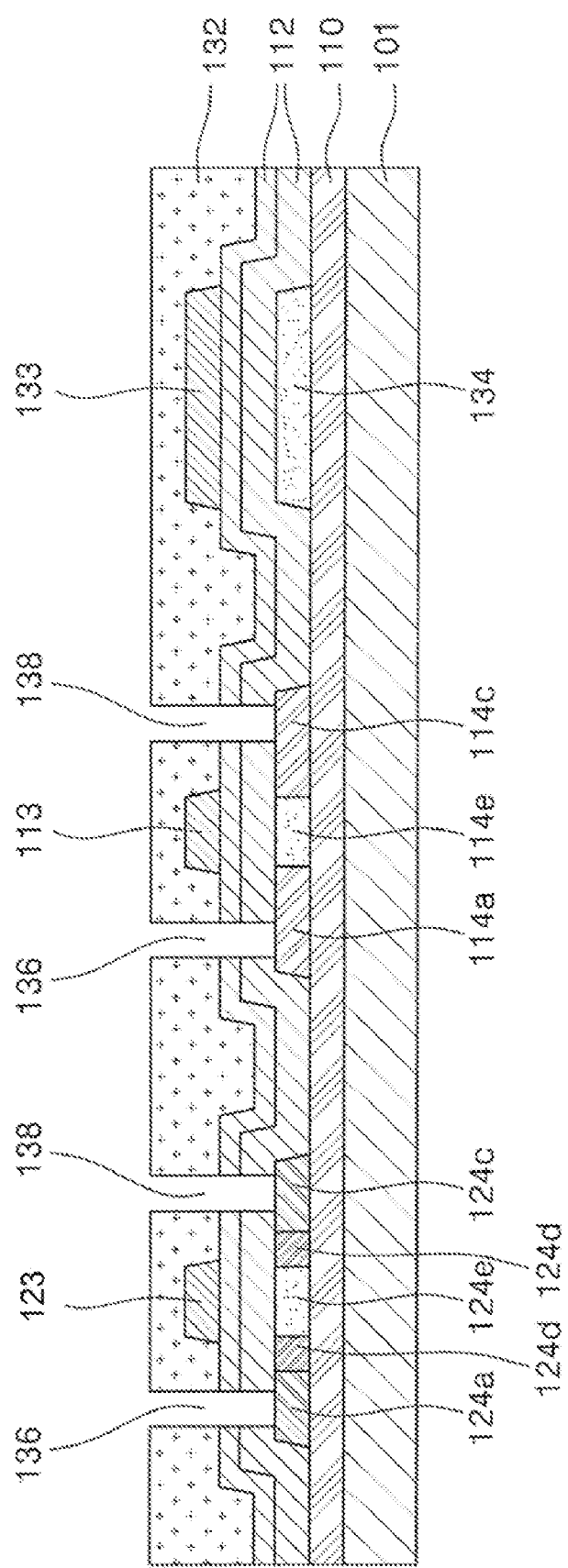

METHOD OF FABRICATING THIN FILM TRANSISTOR ARRAY SUBSTRATE

CLAIM OF PRIORITY

This application makes reference to, incorporates the same herein, and claims all benefits accruing under 35 U.S.C. §119 from an application for METHOD OF FABRICATING THIN FILM TRANSISTOR ARRAY SUBSTRATE earlier filed in the Korean Intellectual Property Office on 11 Aug. 2006 and there duly assigned Serial No. 2006-0076297.

BACKGROUND OF THE INVENTION

1. Field of the Invention

The present invention relates to a method of fabricating a thin film transistor (TFT) array substrate, and more particularly, to a method of fabricating a TFT array substrate having improved reliability.

2. Description of the Related Art

A TFT array substrate includes a p-channel metal-oxide semiconductor (PMOS) TFT, an n-channel metal-oxide semiconductor (NMOS) TFT, and a storage capacitor. According to the method of fabricating a TFT array substrate, a buffer layer is formed on a substrate. On the substrate on which the buffer layer is formed, a semiconductor layer of a PMOS TFT, a semiconductor layer of an NMOS TFT, and a lower electrode pattern of a storage capacitor are formed by a first mask process. Subsequently, a gate insulating layer is formed on the entire surface of the substrate on which the semiconductor layer of the PMOS TFT, the semiconductor layer of the NMOS TFT, and the lower electrode pattern of the storage capacitor are formed.

On the substrate on which the gate insulating layer formed, a photoresist pattern is formed by a photolithography process using a second mask to cover the entire surface of the semiconductor layer of the PMOS TFT and expose regions, in which a source region and a drain region of the NMOS TFT will be formed, in the semiconductor layer of the NMOS TFT and the lower electrode pattern of the storage capacitor. Subsequently, N+ ions, such as phosphor (P), arsenic (As), antimony (Sb), bismuth (Bi), etc. are injected into the exposed semiconductor layer of the NMOS TFT and the exposed lower electrode pattern of the storage capacitor using the photoresist pattern as a mask, thereby forming a source region and a drain region of the NMOS TFT and a lower electrode of the storage capacitor. Then, the photoresist pattern is removed by a strip process.

On the substrate on which the source and drain regions of the NMOS TFT and the lower electrode of the storage capacitor are formed, a gate electrode of the PMOS TFT overlapping a region in which a channel of the PMOS TFT will be formed, a gate electrode of the NMOS TFT overlapping a region in which a channel of the NMOS TFT will be formed, and an upper electrode of the storage capacitor overlapping the lower electrode of the storage capacitor are formed by a third mask process. Here, the gate electrode of the NMOS TFT is formed to have a smaller width than the photoresist pattern for forming the source region and the drain region of the NMOS TFT. Subsequently, using the gate electrode of the PMOS TFT, the gate electrode of the NMOS transistor, and the upper electrode of the storage capacitor as masks, N− ions are injected into the exposed semiconductor layer of the PMOS TFT and the exposed semiconductor layer of the NMOS TFT, thereby defining the channel of the PMOS TFT overlapping the gate electrode of the PMOS TFT and the channel of the NMOS TFT overlapping the gate electrode of the NMOS TFT, and forming lightly doped drain (LDD) regions of the NMOS TFT between the channel and the source and drain regions of the NMOS TFT.

On the substrate having the LDD regions of the NMOS TFT formed thereon, a photoresist pattern covering the entire surface of the semiconductor layer of the NMOS TFT is formed by a photolithography process using a fourth mask. Subsequently, using the photoresist pattern as a mask, P+ ions, such as boron (B), aluminum (Al), gallium (Ga), indium (In), etc., are injected into regions, in which a source region and a drain region of the PMOS TFT will be formed, in the exposed semiconductor layer of the PMOS TFT, thereby forming a source region and a drain region of the PMOS TFT. Then, the photoresist pattern is removed by a strip process.

After an interlayer insulating layer is formed on the entire surface of the substrate having the source region and the drain region of the PMOS TFT formed thereon, source contact holes and drain contact holes are formed by a fifth mask process to penetrate the gate insulating layer and the interlayer insulating layer and expose the source and drain regions of the PMOS TFT and the source and drain regions of the NMOS TFT. Subsequently, a source electrode and a drain electrode of the PMOS TFT connected with the source and drain regions of the PMOS TFT, and a source electrode and a drain electrode of the NMOS TFT connected with the source and drain regions of the NMOS TFT are formed by a sixth mask process.

As described above, the method of fabricating a TFT array substrate includes photolithography processes to form the photoresist patterns for N+ ion injection, formation of the gate electrodes, and P+ ion injection after the gate insulating layer is formed and before the interlayer insulating layer is formed. The photoresist patterns include a large number of mobile ions therein. In the processes of N+ ion injection, formation of the gate electrodes, and P+ ion injection, the mobile ions move to the semiconductor layers of the PMOS and NMOS TFTs through the gate insulating layer. Then, the moved mobile ions affect the operation of the PMOS and NMOS TFTs. Consequently, the PMOS and NMOS TFTs are affected in their operations by the mobile ions moved from the photoresist patterns to the semiconductor layers of the PMOS and NMOS TFTs, thus deteriorating the reliability of the PMOS and NMOS TFTs.

In addition, another method of fabricating a TFT array substrate includes forming a lower electrode of a storage capacitor by injecting N+ ions, thus requiring a photolithography process for N+ ion injection so as to form a lower electrode pattern of the storage capacitor, which is formed together with a semiconductor layer of a PMOS TFT, as the lower electrode of the storage capacitor. Therefore, after a gate insulating layer is formed and before an interlayer insulating layer is formed, a method of fabricating a PMOS TFT includes a photolithography process for N+ ion injection to form the lower electrode pattern as the lower electrode and a photolithography process for forming a gate electrode of the PMOS TFT and P+ ion injection.

In this other method of fabricating a TFT array substrate includes photolithography processes after the gate insulating layer is formed and before the interlayer insulating layer is formed. Consequently, as described above, the PMOS TFT is affected in its operation by the mobile ions moved from the photoresist pattern to the gate insulating layer, thus deteriorating the reliability of the PMOS TFT. Furthermore, since the lower electrode of the storage capacitor is formed by injecting N+ ions, the process of fabricating a PMOS TFT is complicated.

SUMMARY OF THE INVENTION

The present invention provides a method of fabricating a thin film transistor (TFT) array substrate having improved reliability.

According to one aspect of the present invention, there is provided a method of fabricating a thin film transistor (TFT) array substrate, including forming a buffer layer on an entire surface of a substrate, forming a semiconductor layer of a first TFT, a semiconductor layer of a second TFT, and a lower electrode pattern of a storage capacitor on the substrate having the buffer layer formed thereon, performing channel doping on the semiconductor layers of the first and second TFTs and forming a lower electrode of the storage capacitor by injecting a plurality of first ions into the semiconductor layers of the first and second TFTs and the lower electrode pattern of the storage capacitor, forming a gate insulating layer on an entire surface of the substrate having the semiconductor layers of the first and second TFTs and the lower electrode of the storage capacitor, forming a gate electrode of the first TFT in a region on the gate insulating layer overlapping a region of a channel of the first TFT, a gate electrode of the second TFT in a region on the gate insulating layer overlapping a region of a channel of the second TFT, and an upper electrode of the storage capacitor in a region on the gate insulating layer overlapping the lower electrode of the storage capacitor, forming a source region and a drain region of the second TFT by injecting a plurality of second ions into corresponding regions of the semiconductor layer of the second TFT, forming a source region and a drain region of the first TFT by injecting a plurality of third ions into corresponding regions of the semiconductor layer of the first TFT and forming lightly doped drain (LDD) regions of the second TFT by injecting a plurality of fourth ions into corresponding regions of the semiconductor layer of the second TFT while using the gate electrode of the second TFT as a mask.

The method can also include forming an interlayer insulating layer on an entire surface of the substrate having the LDD regions of the second TFT, forming source contact holes and drain contact holes exposing the source and drain regions of the first and second TFTs through the gate insulating layer and the interlayer insulating layer and forming source electrodes and drain electrodes of the first and second TFTs connected to the source and drain regions of the first and second TFTs through the source contact holes and the drain contact holes. The forming of the source and drain regions of the second TFT can include forming a first photoresist pattern covering an entire surface of the semiconductor layer of the first TFT and the semiconductor layer of the second TFT except for regions corresponding to source and drain regions of the second TFT and injecting the plurality of second ions into an exposed semiconductor layer of the second TFT using the first photoresist pattern as a mask. The forming of the source and drain regions of the first TFT can include forming a second photoresist pattern covering an entire surface of the semiconductor layer of the second TFT and injecting the plurality of third ions into an exposed semiconductor layer of the first TFT using the second photoresist pattern as a mask.

The semiconductor layer of the first TFT, the semiconductor layer of the second TFT, and the lower electrode pattern of the storage capacitor can include polysilicon. The forming of the gate insulating layer can include stacking a silicon oxide ($SiO_2$) layer having a thickness of 700 to 900 Å and a silicon nitride (SiN) layer having a thickness of 300 to 500 Å in sequence. The plurality of first ions can include a very small amount of an element selected from a group consisting of phosphorous (P) and boron (B). The concentration of the plurality of first ions in the semiconductor layers of the first and second TFTs and the lower electrode pattern of the storage capacitor can range from $5 \times 10^{16}$ atoms/cm$^3$ to $3 \times 10^{17}$ atoms/cm$^3$. The plurality of second ions can include one of phosphorous (P), arsenic (As), antimony (Sb) and bismuth (Bi). The plurality of third ions can include one of boron (B), aluminum (Al), gallium (Ga) and indium (In). The plurality of fourth ions can include one of phosphorous (P), arsenic (As), antimony (Sb), and bismuth (Bi), the plurality of fourth ions having a lower dose than the plurality of second ions. The first TFT can be a p-channel metal-oxide semiconductor (PMOS) TFT, and the second TFT can be an n-channel metal-oxide semiconductor (NMOS) TFT.

According to another aspect of the present invention, there is provided a method of fabricating a thin film transistor (TFT) array substrate, including forming a buffer layer on an entire surface of a substrate, forming a semiconductor layer of a TFT and a lower electrode pattern of a storage capacitor on the substrate having the buffer layer, performing channel doping on the semiconductor layer of the TFT and forming a lower electrode of the storage capacitor by injecting a plurality of first ions into the semiconductor layer of the TFT and the lower electrode pattern of the storage capacitor, forming a gate insulating layer on an entire surface of the substrate having the semiconductor layer of the TFT and the lower electrode of the storage capacitor, forming a gate electrode of the TFT in a region on the gate insulating layer overlapping a region of a channel of the TFT, and forming an upper electrode of the storage capacitor in a region on the gate insulating layer overlapping the lower electrode of the storage capacitor and forming a source region and a drain region of the TFT by injecting a plurality of second ions into the semiconductor layer of the TFT using the gate electrode of the TFT as a mask.

The method can also include forming an interlayer insulating layer on an entire surface of the substrate having the source and drain regions of the TFT, forming a source contact hole and a drain contact hole exposing the source and drain regions of the TFT through the gate insulating layer and the interlayer insulating layer and forming a source electrode and a drain electrode of the TFT connected with the source and drain regions of the TFT through the source and drain contact holes. The semiconductor layer of the TFT and the lower electrode pattern of the storage capacitor can include polysilicon. The forming of the gate insulating layer can include stacking a silicon oxide ($SiO^2$) layer having a thickness of 700 to 900 Å and a silicon nitride (SiN) layer having a thickness of 300 to 500 Å in sequence. The plurality of first ions can include a very small amount of an element selected from a group consisting of phosphorous (P) and boron (B). A concentration of the plurality of first ions in the semiconductor layer of the TFT and the lower electrode pattern of the storage capacitor can range from $5 \times 10^{16}$ atoms/cm$^3$ to $3 \times 10^{17}$ atoms/cm$^3$. The plurality of second ions can include one of boron (B), aluminum (Al), gallium (Ga) and indium (In). The TFT can be a p-channel metal-oxide semiconductor (PMOS) TFT

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 1A to 1F are cross-sectional views illustrating a method of fabricating a thin film transistor (TFT) array substrate;

FIGS. 3A to 3G are cross-sectional views illustrating a method of fabricating a TFT array substrate according to a first exemplary embodiment of the present invention;

DETAILED DESCRIPTION OF THE INVENTION

Figure 1B:
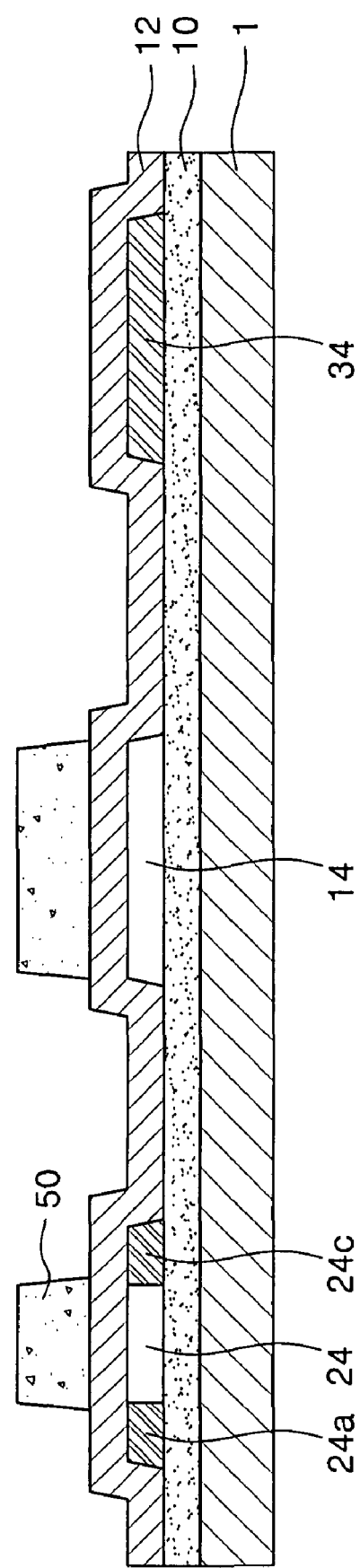

A TFT array substrate includes a p-channel metal-oxide semiconductor (PMOS) TFT, an n-channel metal-oxide semiconductor (NMOS) TFT, and a storage capacitor. FIGS. 1A to 1F are cross-sectional views illustrating a method of fabricating a TFT array substrate. Referring to FIG. 1A, according to the method of fabricating a TFT array substrate, a buffer layer 10 is formed on a substrate 1. On the substrate 1 on which the buffer layer 10 is formed, a semiconductor layer 14 of a PMOS TFT, a semiconductor layer 24 of an NMOS TFT, and a lower electrode pattern 34a of a storage capacitor are formed by a first mask process. Subsequently, a gate insulating layer 12 is formed on the entire surface of the substrate 1 on which the semiconductor layer 14 of the PMOS TFT, the semiconductor layer 24 of the NMOS TFT, and the lower electrode pattern 34a of the storage capacitor are formed.

Referring to FIG. 1B, on the substrate 1 on which the gate insulating layer 12 formed, a photoresist pattern 50 is formed by a photolithography process using a second mask to cover the entire surface of the semiconductor layer 14 of the PMOS TFT and expose regions, in which a source region and a drain region of the NMOS TFT will be formed, in the semiconductor layer 24 of the NMOS TFT and the lower electrode pattern 34a of the storage capacitor. Subsequently, N+ ions, such as phosphor (P), arsenic (As), antimony (Sb), bismuth (Bi), etc. are injected into the exposed semiconductor layer 24 of the NMOS TFT and the exposed lower electrode pattern 34a of the storage capacitor using the photoresist pattern 50 as a mask, thereby forming a source region 24a and a drain region 24c of the NMOS TFT and a lower electrode 34 of the storage capacitor. Then, the photoresist pattern 50 is removed by a strip process.

Figure 1C:
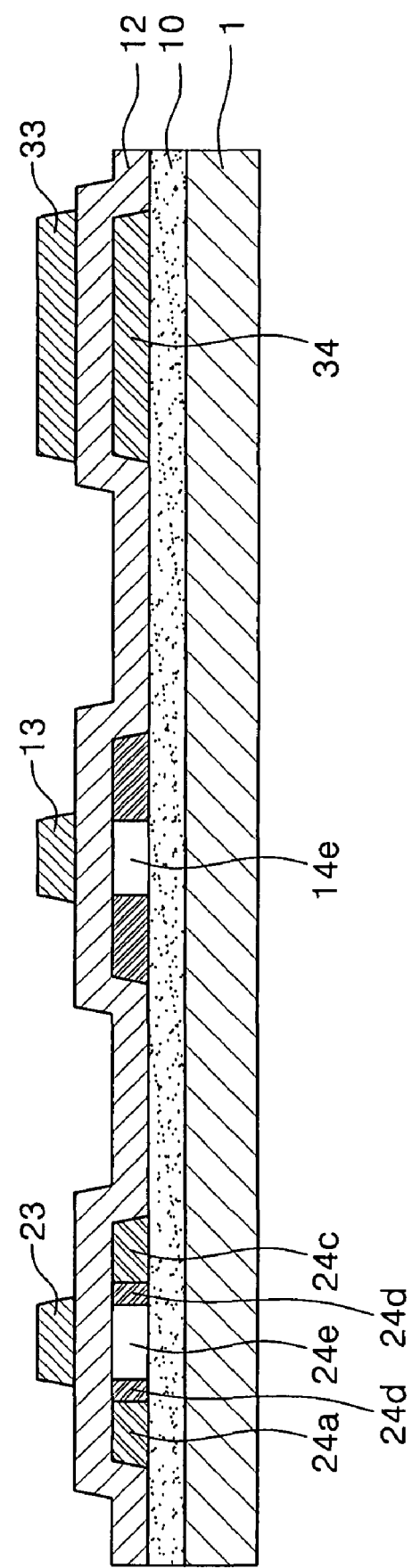

Referring to FIG. 1C, on the substrate 1 on which the source and drain regions 24a and 24c of the NMOS TFT and the lower electrode 34 of the storage capacitor are formed, a gate electrode 13 of the PMOS TFT overlapping a region in which a channel 14e of the PMOS TFT will be formed, a gate electrode 23 of the NMOS TFT overlapping a region in which a channel 24e of the NMOS TFT will be formed, and an upper electrode 33 of the storage capacitor overlapping the lower electrode 34 of the storage capacitor are formed by a third mask process. Here, the gate electrode 23 of the NMOS TFT is formed to have a smaller width than the photoresist pattern 50 for forming the source region 24a and the drain region 24c of the NMOS TFT. Subsequently, using the gate electrode 13 of the PMOS TFT, the gate electrode 23 of the NMOS transistor, and the upper electrode 33 of the storage capacitor as masks, N− ions are injected into the exposed semiconductor layer 14 of the PMOS TFT and the exposed semiconductor layer 24 of the NMOS TFT, thereby 7 defining the channel 14e of the PMOS TFT overlapping the gate electrode 13 of the PMOS TFT and the channel 24e of the NMOS TFT overlapping the gate electrode 23 of the NMOS TFT, and forming lightly doped drain (LDD) regions 24d of the NMOS TFT between the channel 24e and the source and drain regions 24a and 24c of the NMOS TFT.

Figure 1D:
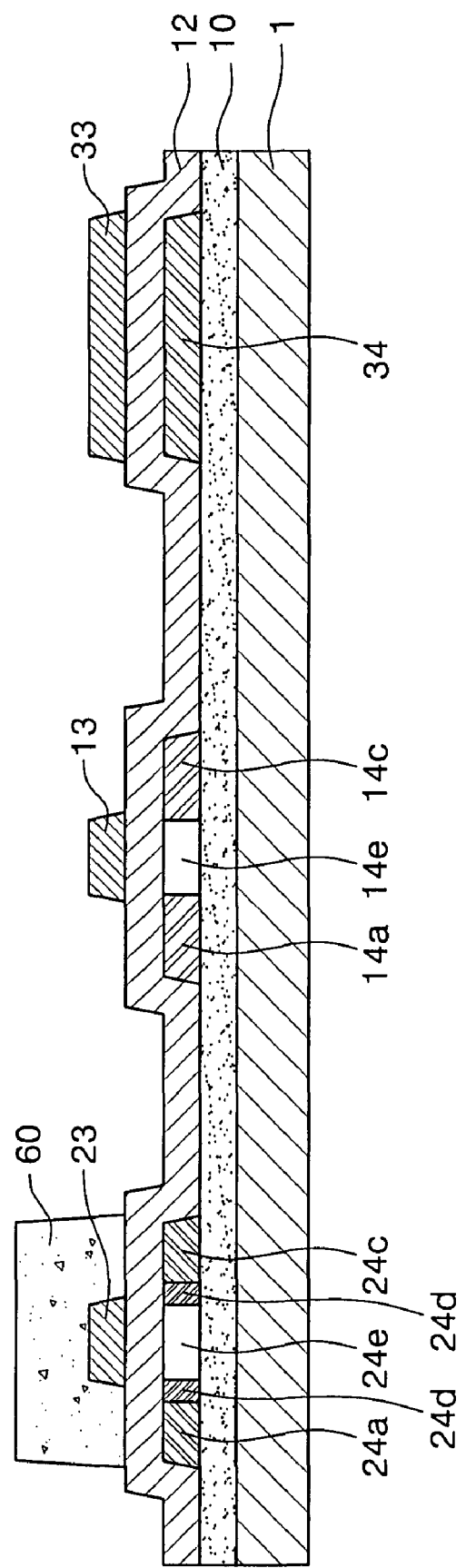

Referring to FIG. 1D, on the substrate 1 having the LDD regions 24d of the NMOS TFT formed thereon, a photoresist pattern 60 covering the entire surface of the semiconductor layer 24a to 24e of the NMOS TFT is formed by a photolithography process using a fourth mask. Subsequently, using the photoresist pattern 60 as a mask, P+ ions, such as boron (B), aluminum (Al), gallium (Ga), indium (In), etc., are injected into regions, in which a source region and a drain region of the PMOS TFT will be formed, in the exposed semiconductor layer 14 of the PMOS TFT, thereby forming a source region 14a and a drain region 14c of the PMOS TFT. Then, the photoresist pattern 60 is removed by a strip process.

Figure 1E:
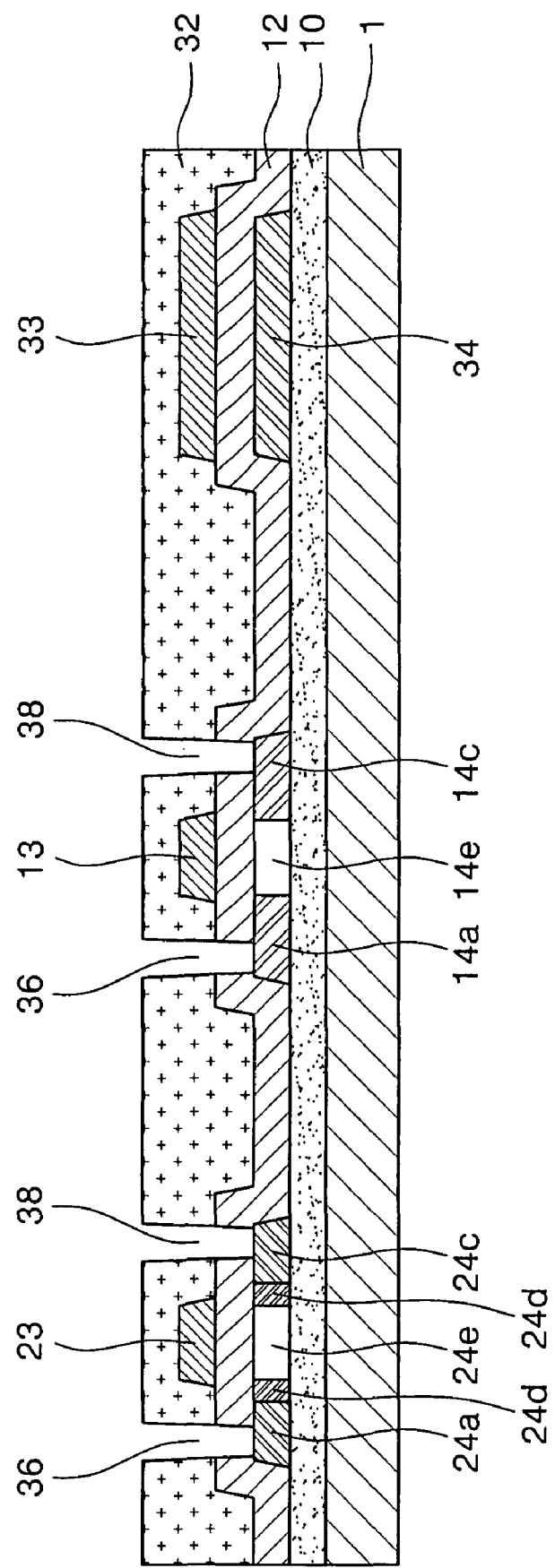

Referring to FIG. 1E, after an interlayer insulating layer 32 is formed on the entire surface of the substrate 1 having the source region 14a and the drain region 14c of the PMOS TFT formed thereon, source contact holes 36 and drain contact holes 38 are formed by a fifth mask process to penetrate the gate insulating layer 12 and the interlayer insulating layer 32 and expose the source and drain regions 14a and 14c of the PMOS TFT and the source and drain regions 24a and 24c of the NMOS TFT. Subsequently, as illustrated in FIG. 1F, a source electrode 15 and a drain electrode 16 of the PMOS TFT connected with the source and drain regions 14a and 14c of the PMOS TFT, and a source electrode 25 and a drain electrode 26 of the NMOS TFT connected with the source and drain regions 24a and 24c of the NMOS TFT are formed by a sixth mask process.

As described above, the method of fabricating a TFT array substrate includes 3 photolithography processes to form the photoresist patterns for N+ ion injection, formation of the gate electrodes 13 and 23, and P+ ion injection after the gate insulating layer 12 is formed and before the interlayer insulating layer 32 is formed. The photoresist patterns include a large number of mobile ions therein. In the processes of N+ ion injection, formation of the gate electrodes 13 and 23, and P+ ion injection, the mobile ions move to the semiconductor layers 14 and 24 of the PMOS and NMOS TFTs through the gate insulating layer 12. Then, the moved mobile ions affect the operation of the PMOS and NMOS TFTs. Consequently, the PMOS and NMOS TFTs are affected in their operations by the mobile ions moved from the photoresist patterns to the semiconductor layers 14 and 24 of the PMOS and NMOS TFTs, thus deteriorating the reliability of the PMOS and NMOS TFTs.

Figure 2A:
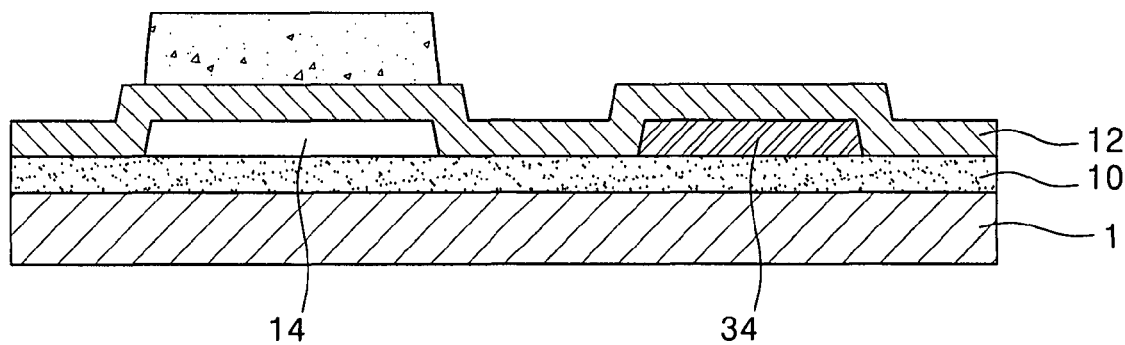
FIGS. 2A and 2B are cross-sectional views illustrating a part of another method of fabricating a TFT array substrate.

In addition, as illustrated in FIG. 2A, another method of fabricating a TFT array substrate includes forming a lower electrode 34 of a storage capacitor by injecting N+ ions, thus requiring a photolithography process for N+ ion injection so as to form a lower electrode pattern 34a of the storage capacitor, which is formed together with a semiconductor layer 14 of a PMOS TFT, as the lower electrode 34 of the storage capacitor. Therefore, after a gate insulating layer 12 is formed and before an interlayer insulating layer 32 is formed, a method of fabricating a PMOS TFT includes a photolithography process for N+ ion injection to form the lower electrode pattern 34a as the lower electrode 34 and a photolithography process for forming a gate electrode 13 of the PMOS TFT and P+ ion injection as illustrated in FIG. 2B.

Figure 2B:
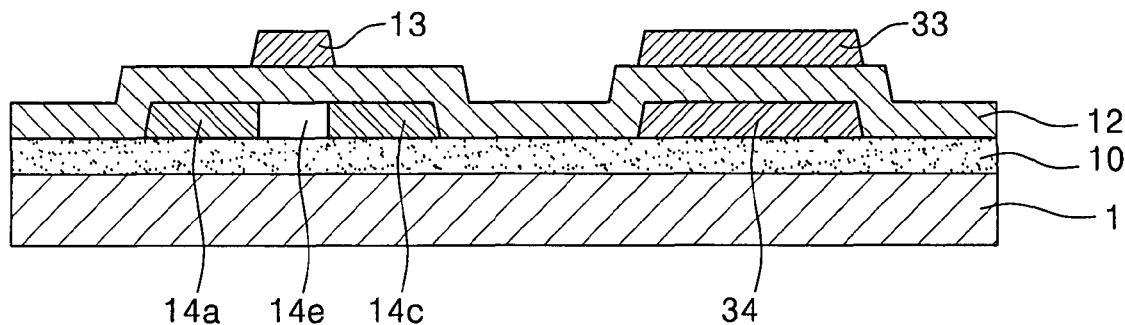

In the method of FIGS. 2A and 2B, another method of fabricating a TFT array substrate includes 2 photolithography processes after the gate insulating layer 12 is formed and before the interlayer insulating layer 32 is formed. Consequently, as described above, the PMOS TFT is affected in its operation by the mobile ions moved from the photoresist pattern to the gate insulating layer 12, thus deteriorating the reliability of the PMOS TFT. Furthermore, since the lower electrode 34 of the storage capacitor is formed by injecting N+ ions, the process of fabricating a PMOS TFT is complicated.

Figure 3A:
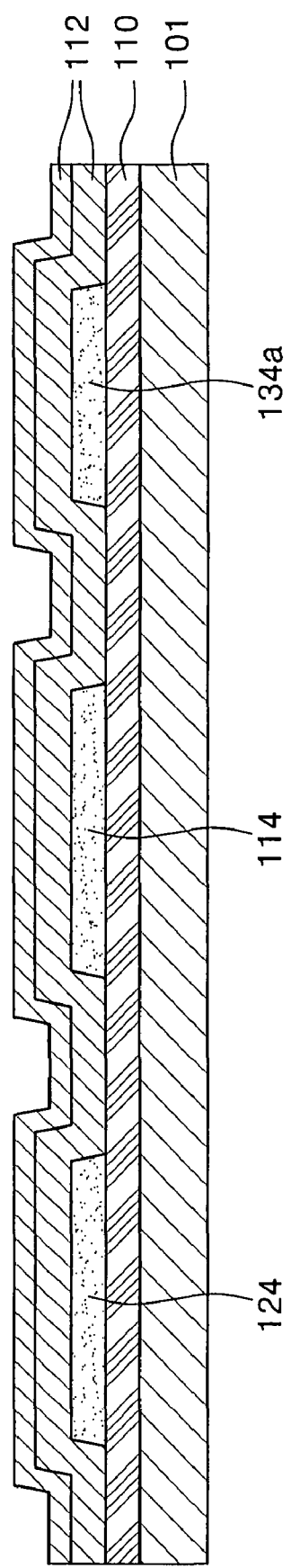

FIGS. 3A to 3G are cross-sectional views illustrating a method of fabricating a thin film transistor (TFT) array substrate according to a first exemplary embodiment of the present invention. Referring to FIG. 3A, the method of fabricating a TFT array substrate includes sequentially forming a buffer layer 110 and a polysilicon layer (not shown in the drawing) on a substrate 101. The polysilicon layer is patterned by a first mask process, thereby forming a semiconductor layer 114 of a p-channel metal-oxide semiconductor (PMOS) TFT, a semiconductor layer 124 of an n-channel metal-oxide semiconductor (NMOS) TFT, and a lower electrode pattern 134a of a storage capacitor on the substrate 101 on which the buffer layer 110 and the polysilicon layer are formed. Subsequently, ions, such as phosphorous (P), boron (B), or so on, are injected into the entire upper surface of the substrate 101 on which the semiconductor layer 114 of the PMOS TFT, the semiconductor layer 124 of the NMOS TFT, and the lower electrode pattern 134a of the storage capacitor are formed, thereby forming a channel-doped semiconductor layer 114b of the PMOS TFT, a channel-doped semiconductor layer 124b of the NMOS TFT, and a channel-doped lower electrode 134 of the storage capacitor, which are doped at a concentration of $5\times10^{16}$ atoms/cm$^3$ to $3\times10^{17}$ atoms/cm$^3$, preferably $1\times10^{17}$ atoms/cm$^3$. Here, the channel-doped semiconductor layer 114b of the PMOS TFT, the channel-doped semiconductor layer 124b of the NMOS TFT, and the channel-doped lower electrode 134 of the storage capacitor are formed by injecting P or B ions at a very low dose and thus do not have conductivity. Subsequently, a gate insulating layer 112 is formed on the entire surface of the substrate 101 on which the channel-doped semiconductor layer 114b of the PMOS TFT, the channel-doped semiconductor layer 124b of the NMOS TFT, and the channel-doped lower electrode 134 of the storage capacitor are formed. The gate insulating layer 112 is formed by stacking a silicon oxide (SiO$_2$) layer having a thickness of 700 to 900 Å and a silicon nitride (SiN) layer having a thickness of 300 to 500 Å in sequence.

Figure 4:
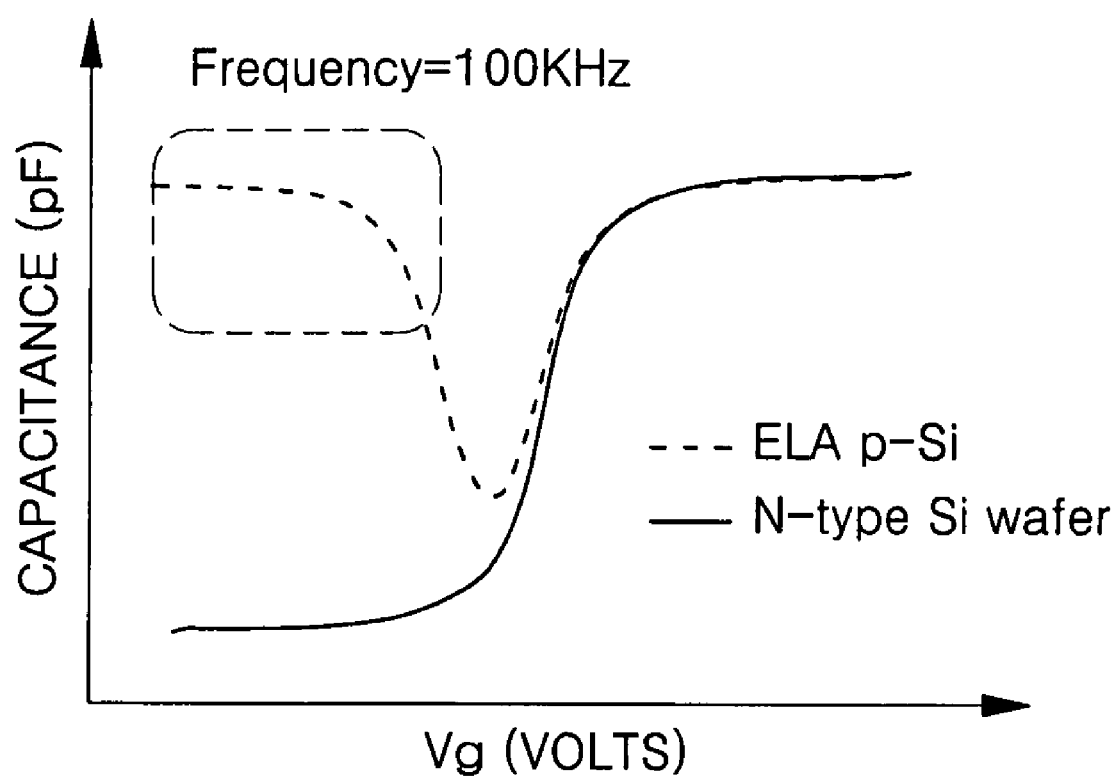
FIG. 4 is a graph showing capacitance of a storage capacitor according to an exemplary embodiment of the present invention.

Here, since a low dose of P or B ions are injected for channel doping, the lower electrode 134 of the storage capacitor does not have conductivity. However, even when a relatively low voltage is applied as illustrated in FIG. 4, the lower electrode 134 can have a high capacitance pF in a high frequency band above several tens of kHz, i.e., 100 kHz. This is because the lower electrode pattern 134a of the storage capacitor is formed by patterning the polysilicon layer and then the lower electrode 134 of the storage capacitor is formed by performing channel doping on the lower electrode pattern 134a of the storage capacitor.

To be specific, with reference to FIG. 4, a capacitor formed by performing channel doping on a single crystalline silicon layer can have a high capacitance only when a relatively high voltage is applied because of very low defect density of the single crystalline silicon layer. However, the capacitor formed by performing channel doping on a polysilicon layer can have a high capacitance pF in a high frequency band above several tens of kHz, i.e., 100 kHz, even when a relatively low voltage is applied because the defect density of the polysilicon layer is higher than that of the single crystalline silicon layer. Therefore, the lower electrode 134 of the storage capacitor can be used as an electrode of the storage capacitor.

Referring to FIG. 3B, on the substrate 101 on which the gate insulating layer 112 is formed, a gate electrode 113 of the PMOS TFT overlapping a region, in which a channel of the PMOS TFT will be formed, in the channel-doped semiconductor layer 114b of the PMOS TFT, a gate electrode 123 of the NMOS TFT overlapping a region, in which a channel of the NMOS TFT will be formed, in the channel-doped semiconductor layer 124b of the NMOS TFT, and an upper electrode 133 of the storage capacitor overlapping the lower electrode 134 of the storage capacitor are formed by a second mask process.

Figure 3C:
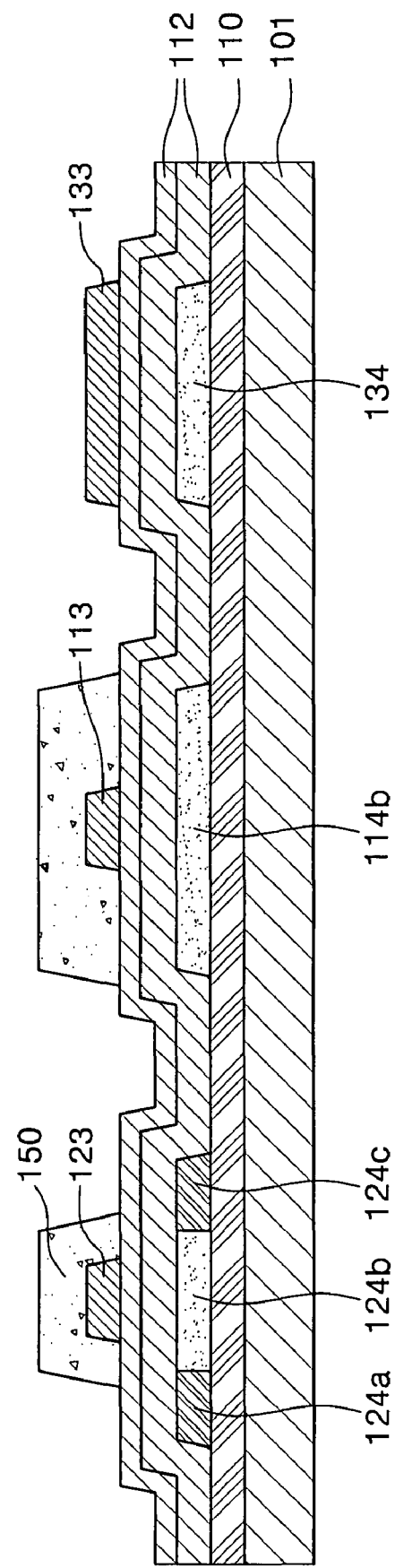

Referring to FIG. 3C, on the substrate 101 on which the gate electrode 113 of the PMOS TFT, the gate electrode 123 of the NMOS TFT, and the upper electrode 133 of the storage capacitor are formed, photoresist patterns 150 are formed by a photolithography process using a third mask to cover the entire region of the channel-doped semiconductor layer 114b of the PMOS TFT and the entire region of the channel-doped semiconductor layer 124b of the NMOS TFT, except for a source region and a drain region of the NMOS TFT. Subsequently, using the photoresist patterns 150 as a mask, N+ ions, such as P, arsenic (As), antimony (Sb), bismuth (Bi), etc., are injected into the exposed source and drain regions of the NMOS TFT, thereby forming a source region 124a and a drain region 124c of the NMOS TFT, which are doped at a concentration of $5\times10^{20}$ atoms/cm$^3$ to $2\times10^{21}$ atoms/cm$^3$, preferably $1\times10^{21}$ atoms/cm$^3$. Then, the photoresist patterns 150 are removed by a strip process.

Figure 3D:
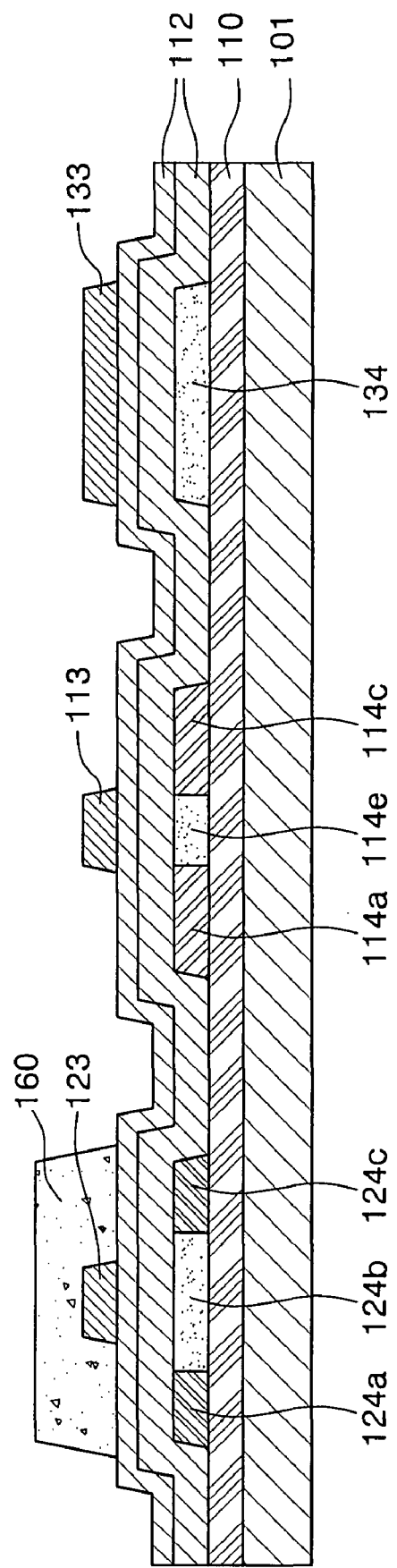

Referring to FIG. 3D, on the substrate 101 on which the source region 124a and the drain region 124c of the NMOS TFT are formed, a photoresist pattern 160 is formed by a photolithography process using a fourth mask to cover the entire surface of the channel-doped semiconductor layer 124a to 124c of the NMOS TFT. Subsequently, using the photoresist pattern 160 as a mask, P+ ions, such as B, aluminum (Al), gallium (Ga), indium (In), etc., are injected into the exposed channel-doped semiconductor layer 114b of the PMOS TFT, thereby forming a source region 114a and a drain region 114c of the PMOS TFT, which are doped at a concentration of $5\times10^{20}$ atoms/cm3 to $2\times10^{21}$ atoms/cm$^3$, preferably $1\times10^{21}$ atoms/cm$^3$. Then, the photoresist pattern 160 is removed by a strip process. Here, since the P+ ions are not injected into a region in which the channel-doped channel 114e of the PMOS TFT will be formed, due to the gate electrode 113 of the PMOS TFT, the channel-doped channel 114e of the PMOS TFT is defined by forming the source and drain regions 114a and 114c of the PMOS TFT.

Referring to FIG. 3E, using the gate electrode 123 of the NMOS TFT as a mask, N− ions, such as P, As, Sb, Bi, etc., are injected into the exposed channel-doped semiconductor layer 124b of the NMOS TFT, thereby defining the channel-doped channel 124e of the NMOS TFT and forming lightly doped drain (LDD) regions 124d of the NMOS TFT, which are doped at a concentration of $5\times10^{18}$ atoms/cm$^3$ to $2\times10^{19}$ atoms/cm$^3$, preferably $1\times10^{19}$ atoms/cm$^3$, between the channel-doped channel 124b of the NMOS TFT and the source and drain regions 124a and 124c of the NMOS TFT. Here, the N− ions are injected into the source and drain regions 124a and 124c of the NMOS TFT as well as the exposed source and drain regions 114a and 114c of the PMOS TFT at a lower dose than the P+ ions injected into the source and drain regions 114a and 114c of the PMOS TFT and the N+ ions injected into the source and drain regions 124a and 124c of the NMOS TFT. Therefore, the N− ions injected into the exposed source and drain regions 114a and 114c of the PMOS TFT and the source and drain regions 124a and 124c of the NMOS TFT do not affect the source and drain regions 114a and 114c of the PMOS TFT nor the source and drain regions 124a and 124c of the NMOS TFT.

Figure 3G:
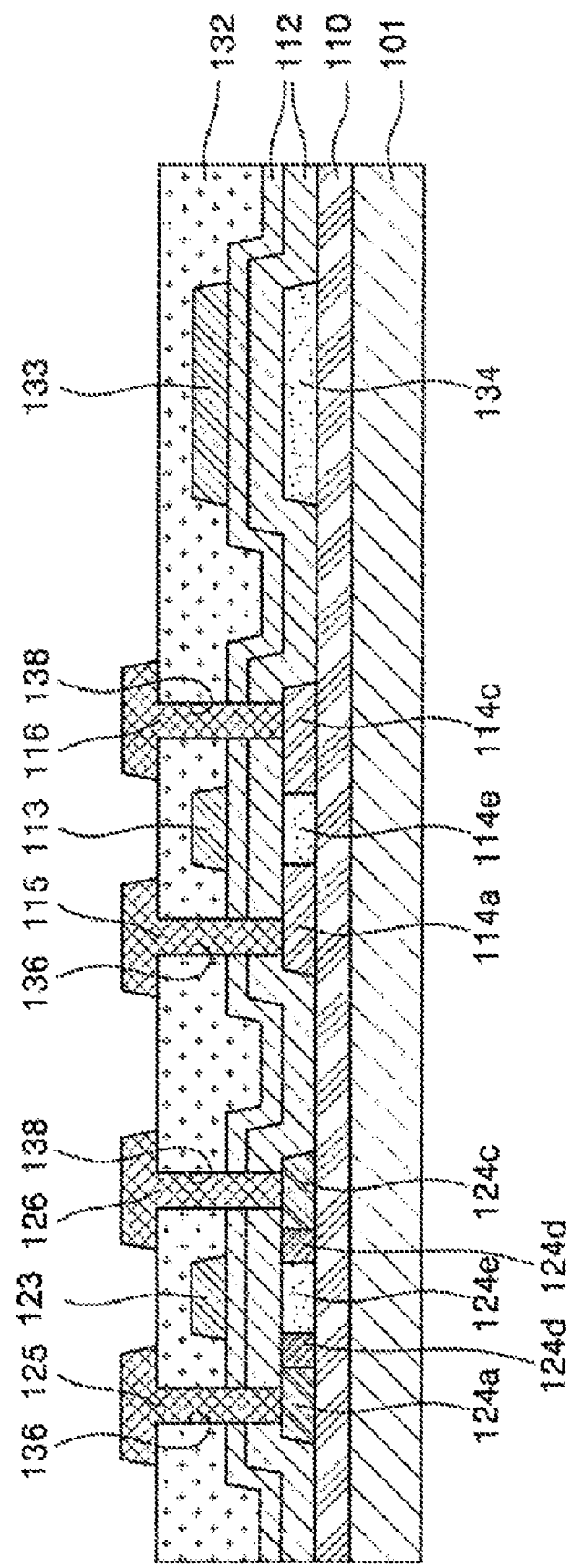

Referring to FIG. 3F, after an interlayer insulating layer 132 is formed on the entire surface of the substrate 101 on which the LDD regions 124d of the NMOS TFT are formed, source contact holes 136 and drain contact holes 138 are formed by a fifth mask process to penetrate the gate insulating layer 112 and the interlayer insulating layer 132 and expose the source and drain regions 114a and 114c of the PMOS TFT and the source and drain regions 124a and 124c of the NMOS TFT. Subsequently, as illustrated in FIG. 3G, using a sixth mask process, source and drain electrodes 115 and 116 of the PMOS TFT are formed to be connected with the source and drain regions 114a and 114c of the PMOS TFT through the source contact hole 136 and the drain contact hole 138, and source and drain electrodes 125 and 126 of the NMOS TFT are formed to be connected with the source and drain regions 124a and 124c of the NMOS TFT through the source contact hole 136 and the drain contact hole 138.

As described above, similar to the method of FIGS. 1 and 2, the method of fabricating a TFT array substrate according to the first exemplary embodiment of the present invention performs 3 photolithography processes for formation of the gate electrodes 113 and 123 of the PMOS and NMOS TFTs, N+ ion injection, and P+ ion injection after the gate insulating layer 112 is formed and before the interlayer insulating layer 132 is formed. However, according to the method of the present invention, the gate electrodes 113 and 123 of the PMOS and NMOS TFTs are formed after the gate insulating layer 112 is formed, and then the photolithography process for N+ ion injection and the photolithography process for P+ ion injection are performed in sequence. Therefore, the method of fabricating a TFT array substrate according to the present invention can prevent mobile ions from moving from the photoresist to the channels 114e and 124e of the PMOS and NMOS TFTs by the gate electrodes 113 and 123 of the PMOS and NMOS TFTs during the photolithography processes for N+ ion and P+ ion injection. Consequently, the PMOS and NMOS TFTs fabricated by the method of the present invention are less affected in their operations by mobile ions and thus can stably operate. As a result, the PMOS and NMOS TFTs fabricated by the method of the present invention have improved reliability.

Figure 5A:
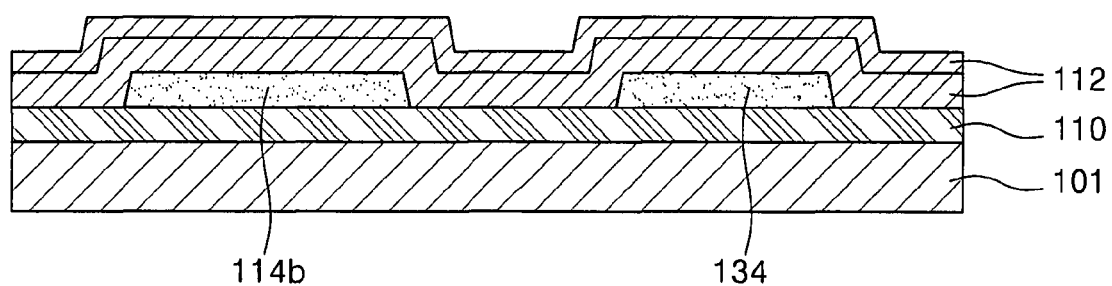
FIGS. 5A to 5D are cross-sectional views illustrating a method of fabricating a TFT array substrate according to a second exemplary embodiment of the present invention.

FIGS. 5A to 5D are cross-sectional views illustrating a method of fabricating a TFT array substrate according to a second exemplary embodiment of the present invention. Referring to FIG. 5A, the method of fabricating a TFT array substrate according to the second exemplary embodiment of the present invention includes sequentially forming a buffer layer 110 and a polysilicon layer (not shown in the drawing) on a substrate 101. The polysilicon layer is patterned by a first mask process, thereby forming a semiconductor layer (not shown in the drawing) of a PMOS TFT and a lower electrode pattern (not shown in the drawing) of a storage capacitor on the substrate 101 on which the buffer layer 110 and the polysilicon layer are formed. Subsequently, ions, such as P, B, or so on, are injected into the entire upper surface of the substrate 101 on which the semiconductor layer of the PMOS TFT and the lower electrode pattern of the storage capacitor are formed, thereby forming a channel-doped semiconductor layer 114b of the PMOS TFT and a lower electrode 134 of the storage capacitor, which are doped at a concentration of $5 \times 10^{16}$ atoms/cm³ to $3 \times 10^{17}$ atoms/cm³, preferably $1 \times 10^{17}$ atoms/cm³. Here, the channel-doped semiconductor layer 114b of the PMOS TFT and the lower electrode 134 of the storage capacitor are formed by injecting P or B ions at a low dose and thus do not have conductivity. As described with reference to FIG. 4, however, the lower electrode 134 of the storage capacitor can be used as an electrode of the storage capacitor. Subsequently, a gate insulating layer 112 is formed on the entire surface of the substrate 101 on which the channel-doped semiconductor layer 114b of the PMOS TFT and the lower electrode 134 of the storage capacitor are formed. The gate insulating layer 112 is formed by stacking a SiO₂ layer having a thickness of 700 to 900 Å and a SiN layer having a thickness of 300 to 500 Å in sequence.

Figure 5B:
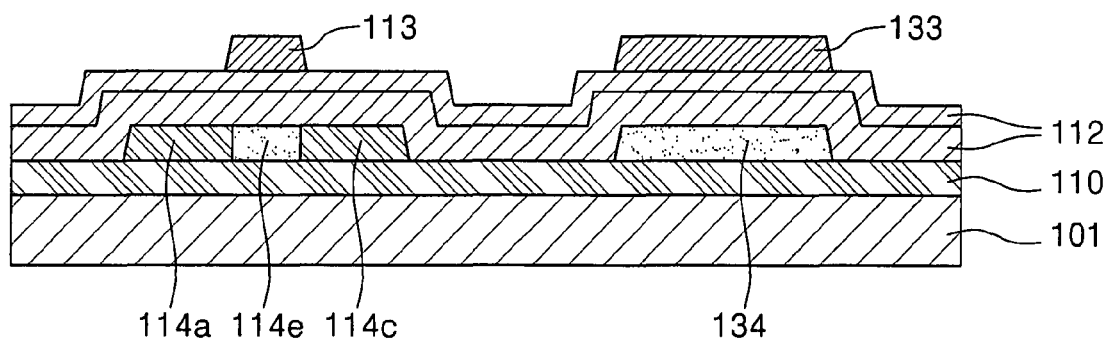

Referring to FIG. 5B, on the substrate 101 on which the gate insulating layer 112 is formed, a gate electrode 113 of the PMOS TFT overlapping a region, in which a channel of the PMOS TFT will be formed, in the channel-doped semiconductor layer 114b of the PMOS TFT and an upper electrode 133 of the storage capacitor overlapping the lower electrode 134 of the storage capacitor are formed by a second mask process. Subsequently, using the gate electrode 113 of the PMOS TFT and the upper electrode 133 of the storage capacitor as masks, P+ ions, such as B, Al, Ga, In, etc., are injected into the exposed channel-doped semiconductor layer 114b of the PMOS TFT, thereby forming a source region 114a and a drain region 114c of the PMOS TFT, which are doped at a concentration of $5 \times 10^{20}$ atoms/cm³ to $2 \times 10^{21}$ atoms/cm³, preferably $1 \times 10^{21}$ atoms/cm³. Here, since the P+ ions are not injected into a region in which the channel-doped channel 114e of the PMOS TFT will be formed due to the gate electrode 113 of the PMOS TFT, the channel-doped channel 114e of the PMOS TFT is defined by forming the source and drain regions 114a and 114c of the PMOS TFT.

Figure 5C:
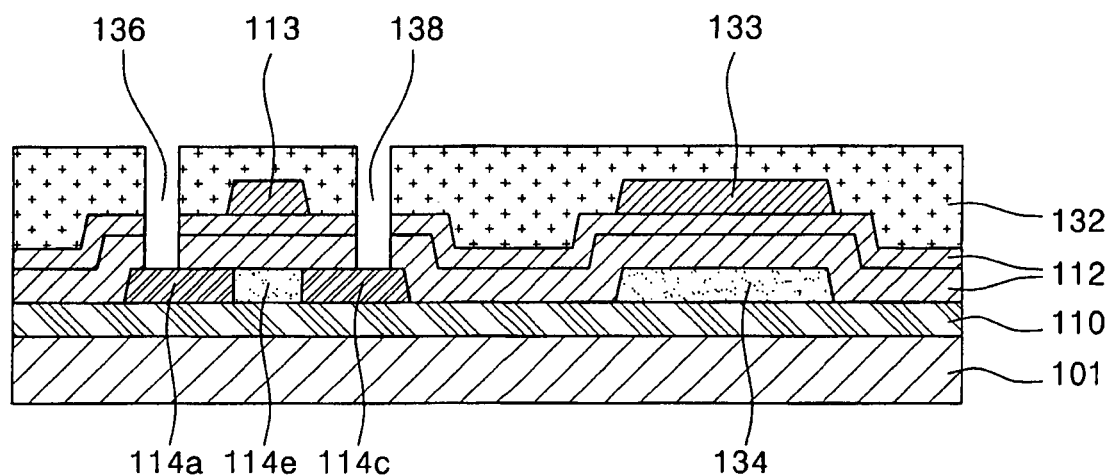
Figure 5D:
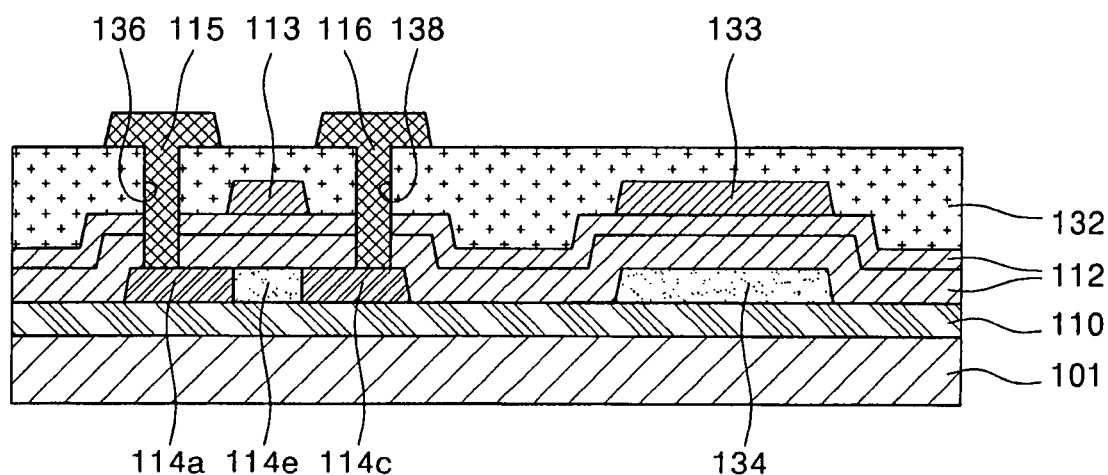

Referring to FIG. 5C, after an interlayer insulating layer 132 is formed on the entire surface of the substrate 101 on which the channel, the source region, and the drain region 114e, 114a, and 114c are formed, a source contact hole 136 and a drain contact hole 138 are formed by a third mask process to penetrate the gate insulating layer 112 and the interlayer insulating layer 132 and expose the source and drain regions 114a and 114c of the PMOS TFT. Subsequently, as illustrated in FIG. 5D, source and drain electrodes 115 and 116 of the PMOS TFT are formed by a fourth mask process to be connected with the source and drain regions 114a and 114c of the PMOS TFT through the source contact hole 136 and the drain contact hole 138.

By doing so, the method of fabricating a TFT array substrate according to the second exemplary embodiment of the present invention forms the lower electrode 134 of the storage capacitor by the channel doping process for the PMOS TFT, thereby omitting a photolithography process for forming the lower electrode 134 of the storage capacitor in comparison with the methods of FIGS. 1A through 1F, 2A and 2B of fabricating a PMOS TFT. Therefore, the methods of fabricating a PMOS TFT according to the present invention can reduce production cost by simplifying the process.

In addition, the method of fabricating a TFT array substrate according to the second exemplary embodiment of the present invention forms the gate electrode 113 of the PMOS TFT after forming the gate insulating layer 112 and then performs the photolithography process for P+ ion injection. In other words, the method of fabricating a PMOS TFT according to the present invention performs the photolithography process for P+ ion injection after forming the gate electrode 113 of the PMOS TFT in comparison with the methods of FIGS. 1A through 1F, 2A and 2B of fabricating a TFT array substrate. Therefore, the method of fabricating a PMOS TFT according to the present invention can prevent mobile ions from moving from the photoresist to the channel 114e of the PMOS TFT by the gate electrode 113 of the PMOS TFT during the photolithography process for P+ ion injection. Thus, the PMOS TFT fabricated by the method of fabricating a TFT array substrate according to the second exemplary embodiment of the present invention is less affected in its operation by mobile ions and thus can stably operate. As a result, the PMOS TFT fabricated by the method of fabricating a TFT array substrate according to the second exemplary embodiment of the present invention has improved reliability.

As described above, a method of fabricating a TFT array substrate according to an exemplary embodiment of the present invention performs photolithography processes for N+ ion injection and P+ ion injection after forming gate electrodes of PMOS and NMOS TFTs. Therefore, the methods of fabricating a TFT array substrate according to the present invention can prevent mobile ions from moving from the photoresist to channels of the PMOS and NMOS TFTs by the gate electrodes of the PMOS and NMOS TFTs. Thus, the PMOS TFT and NMOS TFT fabricated by the methods of fabricating a TFT array substrate according to the present invention are less affected in their operations by mobile ions and thus can stably operate. As a result, the PMOS TFT and NMOS TFT fabricated by the methods of fabricating a TFT array substrate according to the exemplary embodiments of the present invention have improved reliability.

In addition, a method of fabricating a TFT array substrate according to the second exemplary embodiment of the present invention forms a lower electrode of a storage capacitor by a channel doping process for a PMOS TFT, thereby omitting a photolithography process for forming the lower electrode of the storage capacitor in comparison with a conventional method of fabricating a TFT array substrate. Therefore, the method of fabricating a TFT array substrate according to the second exemplary embodiment of the present invention can reduce production cost of a TFT array substrate by simplifying the process.

In addition, the method of fabricating a TFT array substrate according to the second exemplary embodiment of the present invention performs a photolithography process for P+ ion injection after forming the gate electrode of a PMOS TFT. Therefore, the method can prevent mobile ions from moving from the photoresist to the channel of the PMOS TFT by the gate electrode of the PMOS TFT during the photolithography process for P+ ion injection. Thus, the PMOS TFT fabricated by the method of fabricating a TFT array substrate according to the second exemplary embodiment of the present invention is less affected in its operation by mobile ions and thus can stably operate. As a result, the PMOS TFT fabricated by the method of fabricating a TFT array substrate according to the second exemplary embodiment of the present invention has improved reliability.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating a thin film transistor (TFT) array substrate, comprising:
   forming a buffer layer on an entire surface of a substrate;
   forming a semiconductor layer of a first TFT, a semiconductor layer of a second TFT, and a lower electrode pattern of a storage capacitor on the substrate having the buffer layer formed thereon;
   performing channel doping on the semiconductor layers of the first and second TFTs and forming a lower electrode of the storage capacitor by injecting a plurality of first ions into the semiconductor layers of the first and second TFTs and the lower electrode pattern of the storage capacitor;
   forming a gate insulating layer on an entire surface of the substrate having the semiconductor layers of the first and second TFTs and the lower electrode of the storage capacitor;
   forming a gate electrode of the first TFT in a region on the gate insulating layer overlapping a region of a channel of the first TFT, a gate electrode of the second TFT in a region on the gate insulating layer overlapping a region of a channel of the second TFT, and an upper electrode of the storage capacitor in a region on the gate insulating layer overlapping the lower electrode of the storage capacitor;
   forming a source region and a drain region of the second TFT by injecting a plurality of second ions into corresponding regions of the semiconductor layer of the second TFT;
   forming a source region and a drain region of the first TFT by injecting a plurality of third ions into corresponding regions of the semiconductor layer of the first TFT; and
   forming lightly doped drain (LDD) regions of the second TFT by injecting a plurality of fourth ions into corresponding regions of the semiconductor layer of the second TFT while using the gate electrode of the second TFT as a mask, wherein only the second TFT comprises any lightly doped drain (LDD) regions.

2. The method of claim 1, further comprising:
   forming an interlayer insulating layer on an entire surface of the substrate having the LDD regions of the second TFT;
   forming source contact holes and drain contact holes exposing the source and drain regions of the first and second TFTs through the gate insulating layer and the interlayer insulating layer; and
   forming source electrodes and drain electrodes of the first and second TFTs connected to the source and drain regions of the first and second TFTs through the source contact holes and the drain contact holes.

3. The method of claim 1, wherein the forming of the source and drain regions of the second TFT comprises:
   forming a first photoresist pattern covering an entire surface of the semiconductor layer of the first TFT and the semiconductor layer of the second TFT except for regions corresponding to source and drain regions of the second TFT; and
   injecting the plurality of second ions into an exposed semiconductor layer of the second TFT using the first photoresist pattern as a mask.

4. The method of claim 1, wherein the forming of the source and drain regions of the first TFT comprises:
   forming a photoresist pattern covering only an entire surface of the semiconductor layer of the second TFT; and
   injecting the plurality of third ions into an exposed semiconductor layer of the first TFT using the photoresist pattern as a mask.

5. The method of claim 4, wherein the semiconductor layer of the first TFT is absent of any photoresist pattern during said injecting of the plurality of third ions.

6. The method of claim 1, wherein the semiconductor layer of the first TFT, the semiconductor layer of the second TFT, and the lower electrode pattern of the storage capacitor are comprised of polysilicon.

7. The method of claim 1, wherein the forming of the gate insulating layer comprises stacking a silicon oxide ($SiO_2$)

layer having a thickness of 700 to 900 Å and a silicon nitride (SiN) layer having a thickness of 300 to 500 Å in sequence.

8. The method of claim 1, wherein the plurality of first ions comprise a very small amount of an element selected from a group consisting of phosphorous (P) and boron (B).

9. The method of claim 8, wherein a concentration of the plurality of first ions in the semiconductor layers of the first and second TFTs and the lower electrode pattern of the storage capacitor ranges from $5 \times 10^{16}$ atoms/cm$^3$ to $3 \times 10^{17}$ atoms/cm$^3$.

10. The method of claim 1, wherein the plurality of second ions comprise an element selected from a group consisting of phosphorous (P), arsenic (As), antimony (Sb) and bismuth (Bi).

11. The method of claim 1, wherein the plurality of third ions comprise an element selected from a group consisting of boron (B), aluminum (Al), gallium (Ga) and indium (In).

12. The method of claim 1, wherein the plurality of fourth ions comprise an element selected from a group consisting of phosphorous (P), arsenic (As), antimony (Sb), and bismuth (Bi), the plurality of fourth ions having a lower dose than the plurality of second ions.

13. The method of claim 1, wherein the first TFT is a p-channel metal-oxide semiconductor (PMOS) TFT, and the second TFT is an n-channel metal-oxide semiconductor (NMOS) TFT.

14. The method of claim 1, the injection of the plurality of fourth ions forming is performed absent of a presence of any photoresist pattern.

15. A method of fabricating a thin film transistor (TFT) array substrate, comprising:
   forming a buffer layer on an entire surface of a substrate;
   forming a semiconductor layer of a first TFT, a semiconductor layer of a second TFT, and a lower electrode pattern of a storage capacitor on the substrate having the buffer layer formed thereon;
   performing channel doping on the semiconductor layers of the first and second TFTs and forming a lower electrode of the storage capacitor by injecting a plurality of first ions into the semiconductor layers of the first and second TFTs and the lower electrode pattern of the storage capacitor;
   forming a gate insulating layer on an entire surface of the substrate having the semiconductor layers of the first and second TFTs and the lower electrode of the storage capacitor;
   forming a gate electrode of the first TFT in a region on the gate insulating layer overlapping a region of a channel of the first TFT, a gate electrode of the second TFT in a region on the gate insulating layer overlapping a region of a channel of the second TFT, and an upper electrode of the storage capacitor in a region on the gate insulating layer overlapping the lower electrode of the storage capacitor;
   forming a source region and a drain region of the second TFT by injecting a plurality of second ions into corresponding regions of the semiconductor layer of the second TFT;
   forming a source region and a drain region of the first TFT by injecting a plurality of third ions into corresponding regions of the semiconductor layer of the first TFT; and
   forming lightly doped drain (LDD) regions of the second TFT in the absence of any photoresist pattern by injecting a plurality of fourth ions into corresponding regions of the semiconductor layer of the second TFT while using the gate electrode of the second TFT as a mask.

16. The method of claim 15, wherein only the second TFT comprises any lightly doped drain (LDD) regions.

17. The method of claim 15, wherein the forming of the source and drain regions of the first TFT comprises:
   forming a photoresist pattern covering only an entire surface of the semiconductor layer of the second TFT; and
   injecting the plurality of third ions into an exposed semiconductor layer of the first TFT using the gate electrode of the first TFT as a mask.

* * * * *